(12) United States Patent
Chiang et al.

(10) Patent No.: US 6,458,706 B1
(45) Date of Patent: Oct. 1, 2002

(54) METHOD OF FORMING CONTACT USING NON-CONFORMAL DIELECTRIC LINER

(75) Inventors: Eddy Chiang, Taouan (TW); Erik S. Jeng, Hsinchu (TW); I-Ping Lee, Taouan (TW); Kuei-Chuen Ho, Hsinchu (TW)

(73) Assignee: Vanguard International Semiconductor Corporation, Hsin-Chu (TW)

( * ) Notice: Subject to any disclaimer, the term of this patent is extended or adjusted under 35 U.S.C. 154(b) by 0 days.

(21) Appl. No.: 09/507,903

(22) Filed: Feb. 22, 2000

(51) Int. Cl.[7] .............................................. H01L 21/302
(52) U.S. Cl. ...................... 438/694; 438/714; 438/720
(58) Field of Search ................................. 438/691, 692, 438/694, 706, 714, 743, 745, 720

(56) References Cited

U.S. PATENT DOCUMENTS

| | | | |
|---|---|---|---|
| 5,162,881 A | 11/1992 | Ohya | 257/309 |
| 5,448,086 A * | 9/1995 | Hida | 257/194 |
| 5,585,308 A * | 12/1996 | Sardella | 437/190 |
| 5,770,510 A * | 6/1998 | Lin et al. | 438/396 |
| 5,856,225 A * | 1/1999 | Lee et al. | 438/291 |
| 5,953,609 A | 9/1999 | Koyama et al. | 438/253 |
| 6,042,999 A * | 3/2000 | Lin et al. | 430/316 |
| 6,255,207 B1 * | 7/2001 | Jang | 438/597 |

* cited by examiner

*Primary Examiner*—Benjamin L. Utech
*Assistant Examiner*—Kin-Chan Chen
(74) *Attorney, Agent, or Firm*—George O. Saile; Stephen B. Ackerman

(57) ABSTRACT

A new method is provided to treat contact holes after hole formation has been completed. A layer of non-conformal dielectric is deposited over the surface in which the contact hole has been formed thereby including the sidewalls and bottom of the contact hole. The non-conformal dielectric will be unevenly deposited on The sidewalls and bottom of the contact hole. This results in a relatively light deposition of non-conformal dielectric along the lower portions of the sidewalls and on the bottom of the contact hole with a heavier coating of non-conformal dielectric being deposited along the upper reaches of the contact hole. The objective of the invention is to prevent the enlargement of the hole diameter during subsequent processing steps. The non-conformal dielectric can be removed from the bottom using a wet etch.

13 Claims, 2 Drawing Sheets

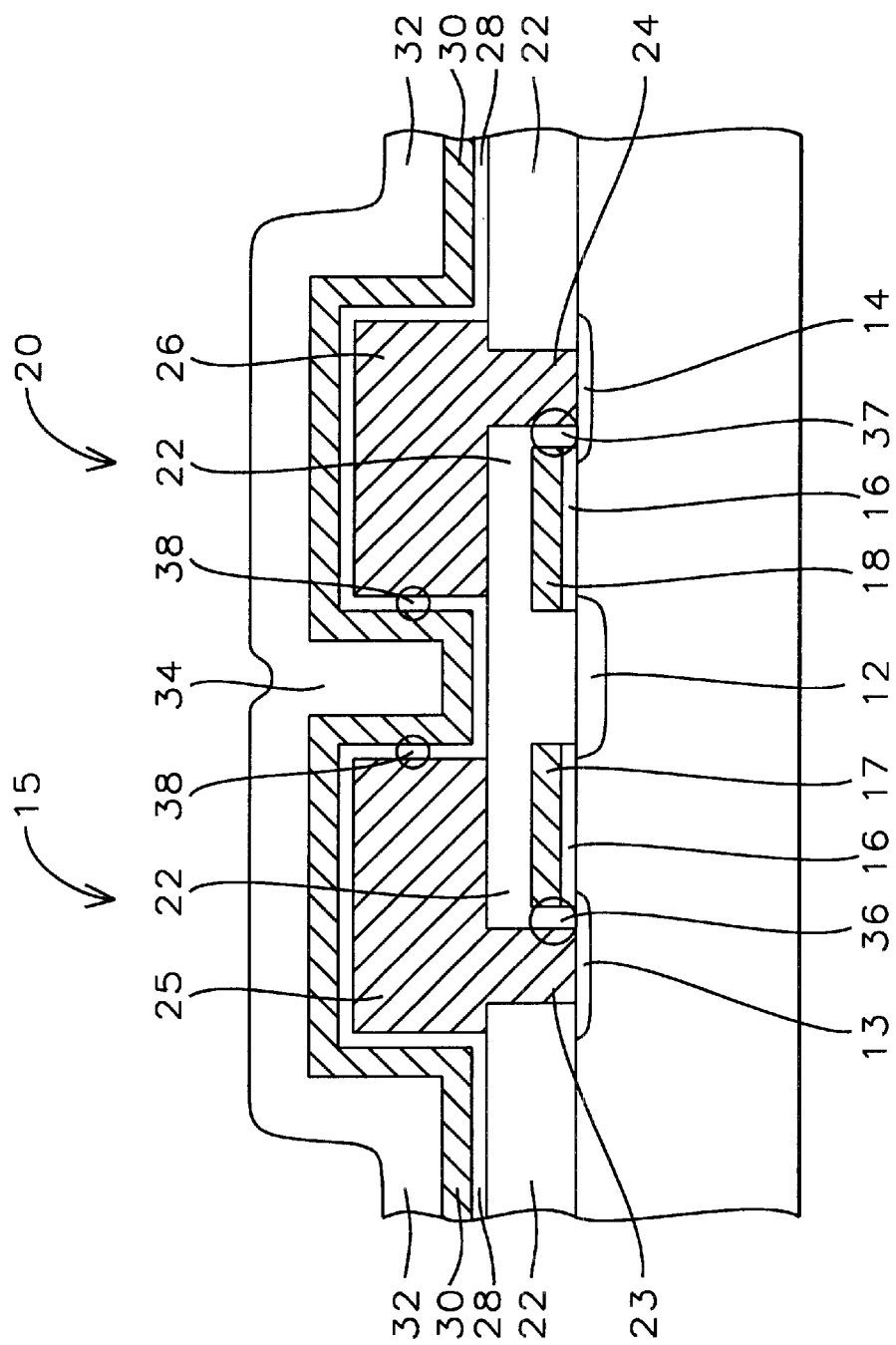
FIG. 1 – Prior Art

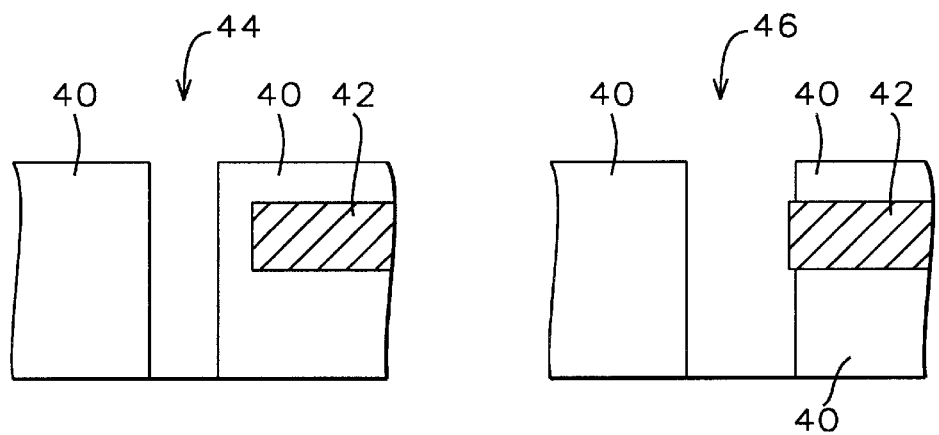
*FIG. 2a –*    *FIG. 2b –*
*Prior Art*    *Prior Art*
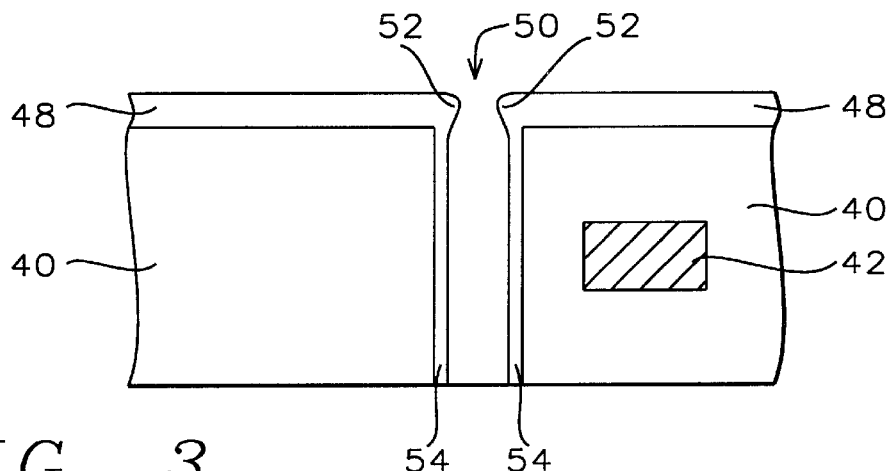
*FIG. 3*
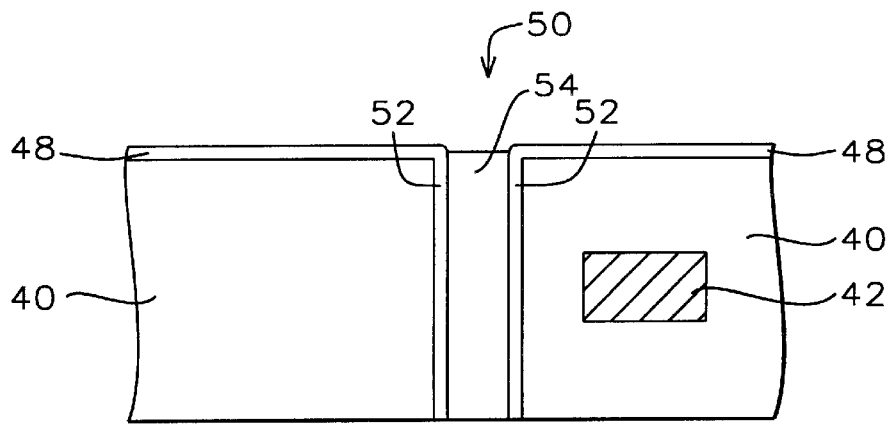
*FIG. 4*

METHOD OF FORMING CONTACT USING NON-CONFORMAL DIELECTRIC LINER

BACKGROUND OF THE INVENTION (1) Field of the Invention

The invention relates to the fabrication of integrated circuit devices, and more particularly, to a method of forming a contact hole whereby the size of the contact hole does not contract due to chemical processes subsequent to forming the contact hole.

(2) Description of the Prior Art

Semiconductor device manufacturing has been evolving ever since its inception whereby one of the driving forces behind this evolution has been to improve device performance while keeping device manufacturing costs under strict and competitive control. This evolution has over the years resulted in reducing device size down to where present day device dimensions are in the deep sub-micron range and are approaching 0.1 um. Device size reductions have resulted in significantly reducing such device performance detractors as parasitic capacitances and interconnect resistances, thereby significantly improving device operational speeds. The reduction in device size has not only resulted in improved device performance but has also allowed for increasing device densities so that the number of devices that can be fabricated using one wafer has increased considerably. Since the manufacturing of semiconductor devices requires the application of many diverse technical disciplines, the advances that have been made in device performance and in device density have been accomplished by numerous advances in these supporting technologies in addition to numerous advances in the design and functional characteristics of semiconductor devices. More particularly, advances in photolithography and the ways in which macro images are projected as micro images on target surfaces have greatly contributed to the progress that has been made. This coupled with advances in etching techniques, specifically Reactive Ion Etching (RIE), have been two of the major driving forces in advancing the semiconductor technology.

The advances that have been made over the years in semiconductor technology have however in many cases been made in small, incremental steps and have frequently required trade-offs and compromises in the best manner in which to implement particular improvements. These compromises are at times required due to problems of device yield and device reliability that are introduced as a consequence of device miniaturization. The invention specifically addresses one of these aspects of device creation that relates to the creation of contact holes. Contact holes are typically used to connect an overlying layer of metal interconnect lines to an underlying device region and can be fabricated having a width or diameter that is smaller than 0.5 um. The metal that is used to fill a contact hole of very small diameter must meet certain requirements of adhesion to the sidewalls of the hole, even and uniform distribution of the metal into and throughout the hole without forming key holes, low electric resistance and low contact resistance, no effects of electromigration or the formation of surface irregularities during its formation or during subsequent processing steps, and the like. For the reasons cited, aluminum, which typically has been used to form interconnect metal lines, is difficult to use for the filling of a contact hole. Aluminum is difficult to deposit using vapor deposition techniques while sputtering aluminum does not provide the desired conformal distribution of the aluminum throughout the cross section of the hole. Aluminum is moreover prone to electromigration, a phenomenon that is more likely to occur in holes of very small diameter due to the high current densities that pass through the metal fill of the contact hole. For these reasons, aluminum as a fill for contact holes is mostly replaced by tungsten that can be deposited with satisfactory results using low pressure CVD (LPCVD) techniques. Tungsten, in addition, can withstand high current concentrations whereby the tungsten remains conformally distributed throughout the contact opening.

As the density of circuit components contained within a semiconductor die has increased and the circuit components have decreased in size and are spaced closer together, it has become increasingly difficult to access selectively a particular region of the silicon wafer through the various layers that are typically superimposed on the surface of the silicon wafer without undesired interference with other active regions. It is especially important to have a technology that can etch openings that have essentially vertical walls, most notably when the openings are to extend deeply into the surface layers. Additionally, to tolerate some misalignment in the masks that are used to define such openings, it is advantageous to provide protection to regions that need isolation but that inadvertently lie partially in the path of the projected opening. To this end it is sometimes the practice to surround such regions with a layer of material that resists etching by the process being used to form the openings.

Using the conventional methods of forming contact holes, it is frequently found that the diameter of the contact hole is enlarged as a result of and after processing steps of wet chemistry treatment. It is apparent that, with the continuing shrinkage of device dimensions and the continuing increase in device density, the critical diameter (CD) of the contact hole is of importance whereby variations in the CD of contact holes are unacceptable. After the contact hole has been formed, the contact hole and its surrounding regions are, during subsequent processing steps, exposed to wet chemistry processing, such as photoresist stripping, which causes the enlargement of the diameter of the contact hole. It is therefore important to provide a method and sequence that prevents this from happening, the method of the invention addresses this concern.

Contact holes form an integral part of the fabrication of DRAM devices. This is further illustrated with the cross section of a typical DRAM that is shown in FIG. 1. The elements that constitute the DRAM memory cell that is shown in FIG. 1 are as follows:

10 is a substrate on the surface of which the DRAM memory cell is created

12 is an impurity implant in the surface of substrate 10 that functions as the bit line of the DRAM cell

13 and 14 provide the memory nodes of the memory cell

15 and 20 are the two stacked memory cells that form the DRAM cell

16 are two thin layers of gate oxide that serve as stress relieve between the underlying substrate and the overlying gate electrodes

17 and 18 are the gate electrodes of the stacked memory cells whereby memory node 14, thin layer 16 (of gate oxide) and gate electrode 18 collectively form one of the two switching transistors of the stacked memory cell while memory node 13, thin layer 16 of gate oxide and gate electrode 17 collectively form the other of the two switching transistors of the stacked memory cell

22 is a thick layer of insulation that covers gate electrodes 17 and 18

23 and 24 are openings that have been created in layer 22 through which the memory nodes 13 and 14 are contacted 25 and 26 form the lower electrodes of the DRAM memory cell 28 is a thin layer of dielectric that serves as insulation layer of the two lower electrodes 25 and 26

30 is the upper electrode of the DRAM structure whereby lower electrode 26 with the thin dielectric layer 28 and the upper electrode 30 form a storage capacitor of the stacked memory cell 20 while lower electrode 25 with the thin dielectric layer 28 and the upper electrode 30 form a storage capacitor of the stacked memory cell 15, and 32 is a layer of insulation that isolates the DRAM memory structure.

The DRAM memory structure is further connected to the surrounding circuitry by depositing a layer of metal (not shown in FIG. 1) over the surface of layer 32 of insulation, typically aluminum, and patterning this layer to make contact with the bit line and capacitor regions of the DRAM structure.

The various openings that have been created in the DRAM structure and that are of interest to the process of the invention and that can serve as examples of the application of the invention are openings 23, 24 and 34, FIG. 1. It is clear from the cross section that is shown in FIG. 1 that in regions 36, 37 and 38 the critical dimensions of openings 23, 24 and 34 are of concern. If the diameter of these openings increases after the openings have been created, it is clear that a short can readily occur between for instance the gate electrode 16 and the lower electrode 25, the same applies to region 37 with the potential for a short developing between the gate electrode 18 and the lower electrode 26. Regions 38 have the same exposure with potentially electrical shorts developing between lower electrodes 25/26 and the upper electrode 30.

This is further and more generically highlighted in FIGS. 2a and 2b. FIG. 2a shows a cross section of a layer 40 wherein a conductor 42 is embedded, an opening 44 has been created in layer 40. FIG. 2b shows a cross section of the opening 44 of FIG. 2a after this openings has (inadvertently) been enlarged resulting in an opening 46 whereby conductor 42 now penetrates the sidewall of opening 46 and will therefore make electrical contact with the conductive fill that is used to fill opening 46. The process of the invention prevents the occurrence of the enlargement of the diameter of opening 44 (FIG. 2a) and, with that, prevents the occurrence of electrical shorts.

SUMMARY OF THE INVENTION

A principle objective of the invention is to avoid contact hole shrinkage during processing steps of wet chemistry.

In accordance with the objectives of the invention a new method is provided to treat contact holes after hole formation has been completed. A layer of non-conformal dielectric is deposited over the surface in which the contact hole has been formed thereby including the sidewalls and bottom of the contact hole. The non-conformal dielectric will be unevenly deposited on the sidewalls and bottom of the contact hole with less non-conformal dielectric being deposited where the non-conformal dielectric has to penetrate deeper into the hole. This results in a relatively light deposition of non-conformal dielectric along the lower portions of the sidewalls and on the bottom of the contact hole with a heavier coating of non-conformal dielectric being deposited along the upper reaches of the contact hole. The objective of the invention is to prevent the enlargement of the hole diameter during subsequent processing steps, the relatively thick layer of non-conformal dielectric that is deposited along the upper reaches of the contact hole provides this prevention. The non-conformal dielectric can be removed from the bottom of the hole using a wet etch that further leaves the non-conformal dielectric in place along the sidewalls of the upper reaches of the contact hole.

BRIEF DESCRIPTION OF THE DRAWINGS

FIG. 1 shows a cross section of a Prior Art DRAM memory cell with examples of where the problem that is addressed by the invention can occur.

FIGS. 2a and 2b show a cross section of a semiconductor layer that contains a conductor that further highlights the effects that enlargement of a contact hole can have on device performance.

FIG. 3 show a cross section of a semiconductor layer that contains a metal conductor whereby a non-conformal layer of dielectric has been deposited over the surface of the layer including the insides of the contact hole.

FIG. 4 shows across section of the contact hole of FIG. 3 after the deposited layer of non-conformal dielectric has been etched back and essentially removed from the bottom of the contact hole.

DESCRIPTION OF THE PREFERRED EMBODIMENTS

Referring now specifically to FIG. 3, there is shown a cross section of a semiconductor layer 40 that contains a metal conductor 42 whereby a non-conformal layer 48 of dielectric has been deposited over the surface of the layer including the insides of the contact hole 50.

It is well known in the art that step coverage varies for dielectric and insulating materials such as dioxides. Step coverage can generally be distinguished as either uniform or conformal depositions and non-conformal depositions. Conformal depositions are depositions where the layer that is deposited is deposited in an even manner and where the deposited layer has the same thickness over the regions where it is deposited. Non-conformal deposition on the other hand shows variation in thickness of the deposited layer. This variation can further be influenced by the angle under which the deposition is made, by the free path that the deposited material travels before impacting the target surface and by surface migration that may occur after the material has been deposited. It is clear that the longer the free path of the deposited material, the less likely it is that the material will form dense concentrations of the material in regions of deposition that contain obstacles or curvatures, such as the top parameter of an opening into which the material is deposited. The ratio of hole depth to hole diameter, commonly referred to as the aspect ratio, will therefore have an effect on the amount of deposited material that will deposit around the upper region of the opening into which the material is deposited. A higher aspect ratio (narrower hole or a hole with a High Aspect Ratio) will result in increased accumulation of the deposited material in such regions. A wide and not very deep opening will on the other hand result in a deposition that approaches a conformal deposition. In view of the fact that with newer, sub-miniaturized semiconductor technologies, the diameter of openings will decrease while the depth of the hole may remains relatively the same, the High Aspect Ratio (HAR) will increase, resulting in holes that lend themselves more readily to non-conformal deposition of dielectrics along the sidewalls and bottom of the holes.

The preferred method of the invention is to deposit a layer 48 of Silicon Oxynitrides (SION) over the surface of layer 40 thereby including the sidewalls and bottom of hole 50. Silicon Oxynitrides typically have characteristics that are a combination of both silicon and nitride, the general formula for SiON is $SiO_xN_y(H_z)$. Silicon Oxynitrides are formed by creating $SiH_4$ with $N_2O$ and $NH_3$. In order to form a non-conformal layer of SiON, a practical application uses $SiO_xN_y$ deposited by PECVD with a gas flow between about 1700 and 2300 sccm of He, a gas flow of between about 80 and 120 sccm of $N_2O$, a gas flow of about 40 sccm of $SiH_4$, at a temperature of between about 380 and 480 degrees C. and at a pressure between about 5 and 8 Torr.

SiON is, in the art, frequently used as a hard mask layer, layer 48 of SiON can be sputter deposited over layer 40 to a thickness of between 100 and 400 Angstrom. One of the characteristics of SiON is that the hard semiconductor mask formed by SiON is opaque to the actinic light that used in photolithography so that light will not be reflected from the polysilicon around the slope of the top of the gate electrode.

It is clear from the cross section that is shown in FIG. 3 that the deposition of the layer 48 of SiON is a non-conformal deposition with a thicker layer of SiON being deposited along the upper reaches 52 of the sidewalls of opening 50 and a thinner layer of SiON being deposited along the lower reaches 54 of the hole 50, thereby including the bottom 56 of hole 50.

The layer 48, shown in cross section in FIG. 3, is, after a wet dip step, either residual on sidewalls of the contact hole 50 or is residual on the surface of the layer 40 of semiconductor material, typically a layer of dielectric. The layer of SiON that is deposited over the surface of layer 40 will be used as an etch stop layer for a subsequent step of CMP which removes excess metal (not shown), deposited over the surface of layer 40, leaving metal only (not shown) in the contact opening 50 of FIG. 3. The layer of SiON that overlies the sidewalls of opening 50 protects the sidewalls during the wet dip, thus avoiding an electrical short between the conductor 42 and the metal plug that is created in opening 50.

FIG. 4 shows a cross section of the hole of FIG. 4 after the layer of SiON has been etched thereby essentially removing the SiON from the bottom of the opening 50 while removing some but essentially leaving the SiON in place around regions 52 of hole 50. The etch of the layer of SiON can use, for example, a solution of ammonia and hydrogen peroxide ($NH_4OH+H_2O_2$) with an etch rate of between about 300 to 900 Angstrom per minute. The etch of the layer of SiON can also be performed via anisotropic RIE of the layer 48 of SiON using $Cl_2$ or $SF_6$ as an etchant. It must be noted in FIG. 4 that the thickness of layer 48 of SiON that is deposited on the surface of the layer 40 is, due to the etch of layer 48, accordingly reduced.

The opening 50 is now lined with a protective coating of SiON while the SiON has been removed from the bottom of the hole thereby making the hole available for electrical connection. The hole is for this purpose filled with for instance polysilicon 58, the polysilicon 58 is, after blanket deposition across the surface of layer 48 and inside hole 52, planarized using Chemical Mechanical Planarization technology. It is clear from the cross section that is shown in FIG. 4 that the opening 50 has maintained its original profile and that the diameter of this opening is not affected by processing steps that apply wet etch chemistry. The layer 48 that is deposited on the inside surfaces of hole 50 prevents the wet chemistry from attacking the sidewalls of opening 50.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for creating a hole in a semiconductor surface, comprising the steps of:

providing a semiconductor substrate said substrate having a semiconductor layer;

patterning and etching a hole in said semiconductor layer;

depositing a non-conformal layer of dielectric over a surface of said semiconductor layer thereby including inside surfaces of said hole;

etching said non-conformal layer of dielectric, thereby removing the dielectric from the bottom of the hole while essentially leaving the dielectric in place around an upper perimeter of the hole and overlying the surface of said semiconductor layer, lining sidewalls of the hole with a protective coating of dielectric, thereby making the hole available for electrical connection;

depositing a layer of conductive material over a surface of said layer of non-conformal dielectric; and planarizing said layer of conductive material using methods of Chemical Mechanical Polishing.

2. The method of claim 1 wherein said semiconductor layer is a surface of said semiconductor substrate.

3. The method of claim 1 wherein said semiconductor layer is a layer selected from the group consisting of a layer of dielectric, a layer of insulation and a layer of passivation.

4. The method of claim 1 wherein said patterning and etching a hole is creating a hole that serves as contact or via hole.

5. The method of claim 1 wherein said depositing a non-conformal layer of dielectric is depositing a layer of SiON whereby said layer of SiON is SiON sputter deposited to a thickness of between 100 and 400 Angstrom.

6. The method of claim 1 wherein said etching said non-conformal layer of dielectric is etching said layer of SiON by applying a solution of ammonia and hydrogen peroxide ($NH_4OH+H_2O_2$) with an etch rate of between about 300 to 900 Angstrom per minute.

7. The method of claim 1 wherein said etching said non-conformal layer of dielectric is etching said layer of SiON by applying an anisotropic RIE using $Cl_2$ or $SF_6$ as an etchant.

8. The method of claim 1, said layer of conductive material comprising polysilicon.

9. The method of claim 1, said conductive material comprising a material selected from the group consisting of aluminum, tungsten, copper, polycide or their alloys.

10. A method for treating a hole in a semiconductor surface, comprising the steps of:

providing a semiconductor substrate said substrate having a semiconductor layer whereby semiconductor layer has been provided with a contact hole or a via hole;

depositing a non-conformal layer of dielectric over a surface of said semiconductor layer thereby including inside surfaces of said contact hole or via hole;

etching said non-conformal layer of dielectric, thereby removing the dielectric from the bottom of the hole while essentially leaving the dielectric in place around an upper perimeter of the hole and overlying the surface of said semiconductor layer, lining sidewalls of the hole with a protective coating of dielectric, thereby making the hole available for electrical connection;

blanket depositing a layer of conductive material over a surface of said layer of non-conformal dielectric; and planarizing said layer of conductive material using methods of Chemical Mechanical Polishing.

11. The method of claim 10 wherein said semiconductor layer is a layer selected from the group consisting of the surface of said substrate and a layer of dielectric and a layer of insulation and a layer of passivation.

12. The method of claim 10 wherein said non-conformal layer of dielectric contains SiON.

13. The method of claim 10, said conductive material comprising a material selected from the group consisting of aluminum, tungsten, copper, polyimide, polycide or their alloys.

* * * * *